United States Patent [19]

Peer

[11] 4,023,069
[45] May 10, 1977

[54] VERTICAL DEFLECTION CIRCUIT
[75] Inventor: John Charles Peer, Indianapolis, Ind.
[73] Assignee: RCA Corporation, New York, N.Y.
[22] Filed: Apr. 28, 1976
[21] Appl. No.: 681,036
[52] U.S. Cl. .............................. 315/397; 315/387
[51] Int. Cl.² .................... H01J 29/70; H01J 29/76
[58] Field of Search ........................... 315/387, 397
[56] References Cited
UNITED STATES PATENTS

| 3,887,842 | 6/1975 | Owens, Jr. et al. | 315/397 |
| 3,965,390 | 6/1976 | Spencer, Jr. | 315/397 |

Primary Examiner—T.H. Tubbesing
Assistant Examiner—T. M. Blum
Attorney, Agent, or Firm—Eugene M. Whitacre; Joseph Laks

[57] ABSTRACT

A push-pull amplifier, which is supplied with a first voltage, provides deflection current to a vertical deflection winding during a trace period of each deflection cycle. The amplifier is switched off by an input waveform to initiate the retrace interval. A voltage developed across the winding to oppose a change in deflection current activates switching means to couple the winding to a second voltage source during retrace. The voltage applied to the winding during retrace is of greater magnitude than the first voltage. The switching means bypasses the winding current away from the main conducting paths of the amplifier during retrace.

9 Claims, 8 Drawing Figures

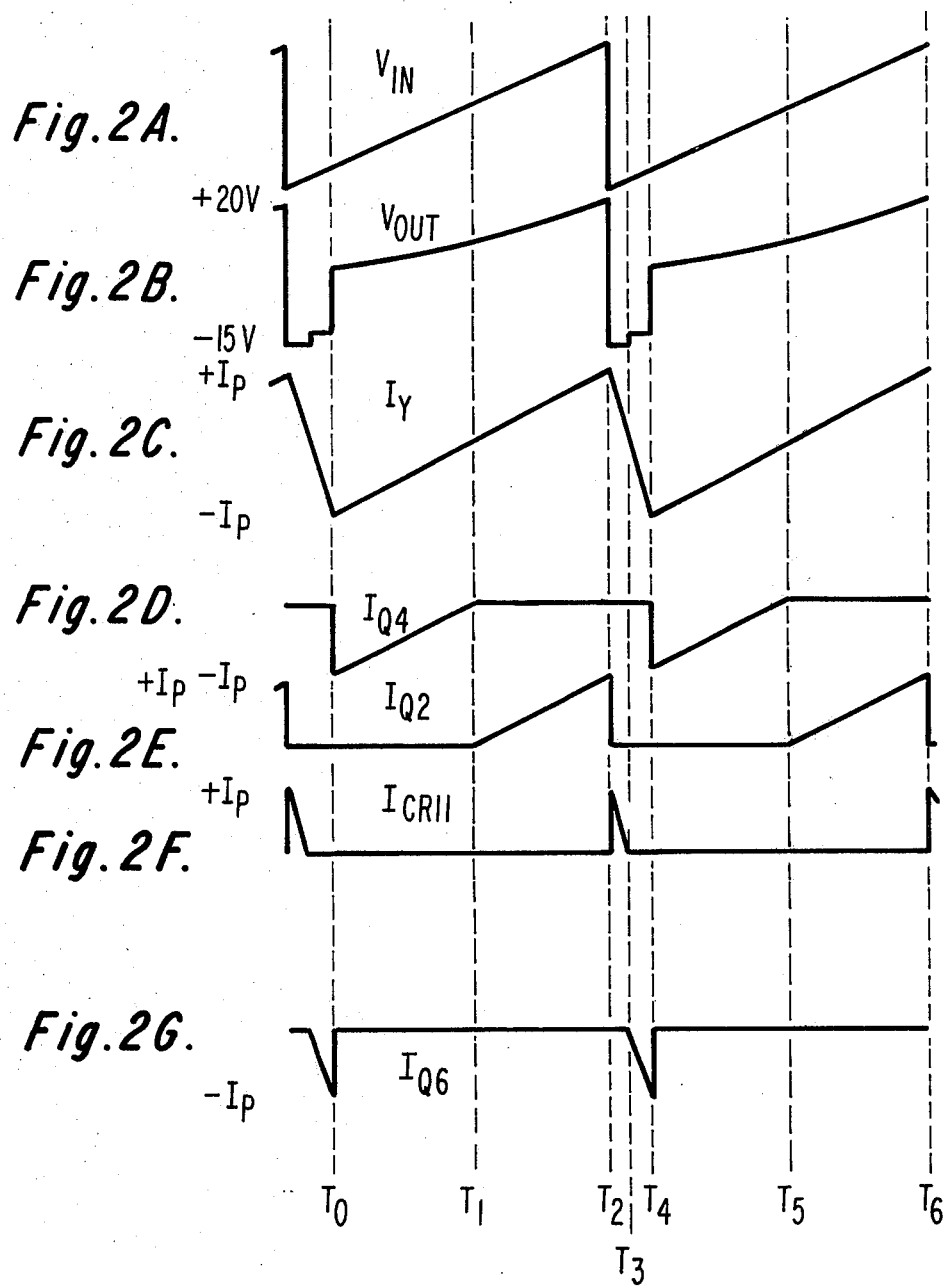

VERTICAL DEFLECTION CIRCUIT

This invention relates to deflection circuits such as television vertical deflection circuit.

The retrace interval in a vertical deflection cycle in the NTSC television system is of relatively short duration, on the order of 1 millisecond or less. During this interval, current completely reverses direction in the deflection winding. Because the winding exhibits more inductive reactance during the retrace interval that during the trace interval, larger magnitude voltages must be supplied to the deflection circuit during retrace to permit complete current reversal if relatively low operating voltage is used during the trace interval. It is desirable, however, not to subject the semiconductor elements, particularly those associated with the output stage of the amplifier, to relatively high voltages which necessitate larger and more costly components.

Energy lost during retrace through resistive dissipation in the deflection circuit elements must be resupplied to the circuit. At a given retrace voltage, current must flow for a longer interval to return the lost energy. Even relatively small losses can appreciably lengthen the retrace interval. It is therefore desirable to minimize the number of components through which the relatively large retrace current flows.

Circuits are known, such as disclosed in U.S. Pat. No. 3,784,857 granted to T. J. Christopher, which recover energy from the retrace pulse by means of a resonant circuit which includes a retrace capacitor. Large retrace voltages, however, exist across transistor elements of the deflection amplifier output stage, requiring relatively expensive transistors able to withstand the higher voltages.

Other circuits are known, such as U.S. Pat. No. 3,917,977 granted to M. Izumisawa, wherein a greater magnitude retrace voltage source is switched to the deflection winding during retrace by means of an inductive voltage pulse generated by the winding. Retrace current, however, is shunted through the amplifier during portions of the retrace interval. In this arrangement, the amplifier output transistors must themselves dissipate current at the higher voltages.

Still other circuits are known, such as U.S. Pat. No. 3,934,173 granted to J. A. C. Korver, which shorten the retrace interval by splitting the deflection winding into two portions, each of which are directly coupled to a voltage source during retrace.

However, these circuits require a multiplicity of switching elements through which heavy currents pass and/or have to withstand high voltages.

SUMMARY OF THE INVENTION

A deflection amplifier provides current to a deflection winding. A first voltage source coupled to the amplifier provides an operating voltage for the amplifier. Input signals defining trace and retrace intervals during the deflection cycle are fed to the amplifier. The amplifier is turned off at the end of the trace interval causing a voltage to be developed across the winding to oppose a change in winding current. Switching means couples the winding to a second voltage source during retrace. The switching means is responsive to the opposing voltage and bypasses the retrace current in the winding away from the main conducting paths of the amplifier during retrace.

BRIEF DESCRIPTION OF THE DRAWINGS

FIG. 2A – 2G are waveforms associated with the circuit of FIG. 1.

DETAILED DESCRIPTION

Figure 1:
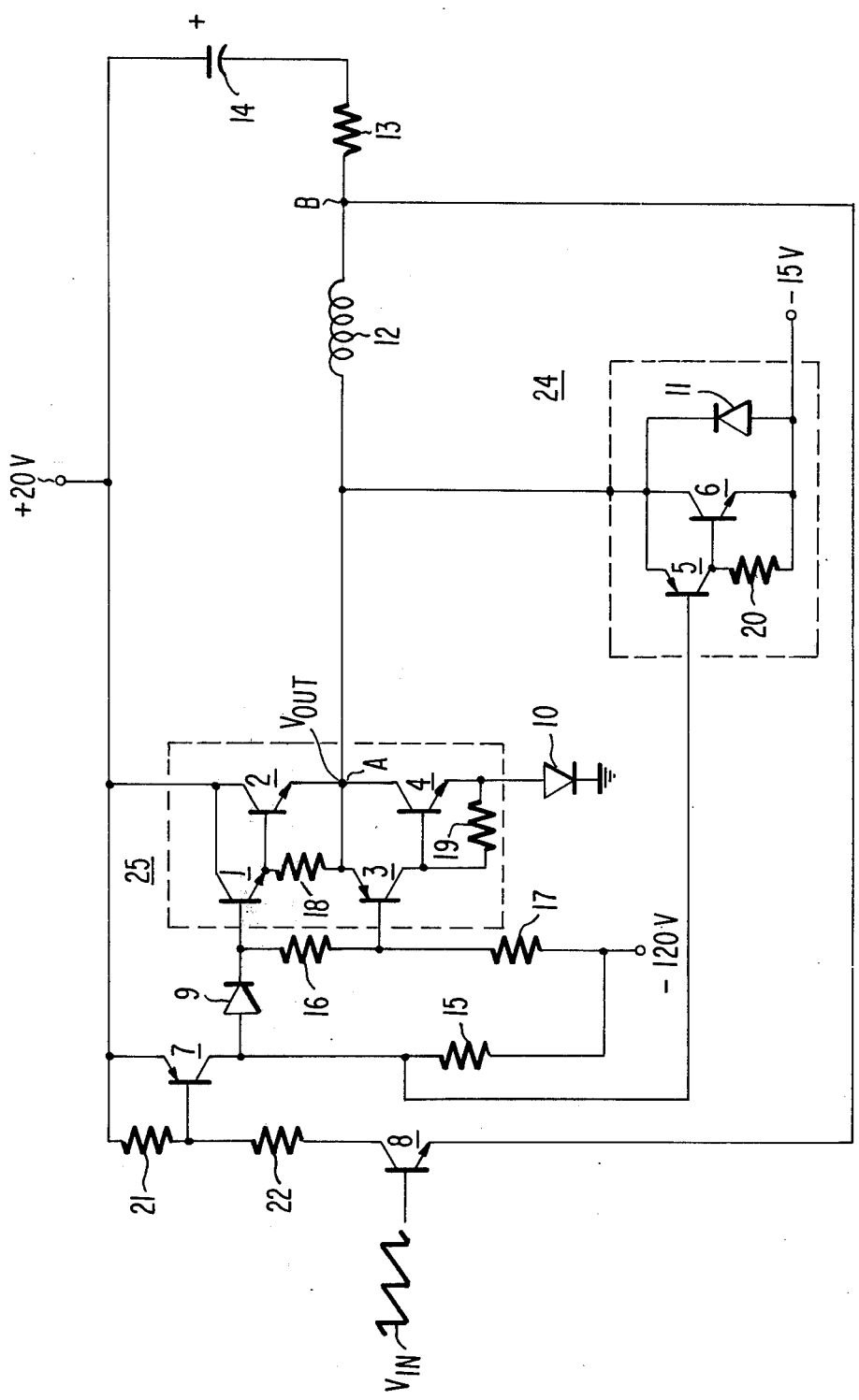
FIG. 1 is a schematic circuit diagram of a deflection circuit embodying the invention.

In FIG. 1, input signal $V_{in}$, obtained from a conventional sawtooth generator, not shown, and defining trace and retrace intervals in a deflection cycle, are fed to the base of an error amplifying transistor 8. The $V_{in}$ waveform is shown in more detail in FIG. 2A. The emitter of transistor 8 is coupled to a junction B of a deflection winding 12 and a feedback resistor 13. The collector of transistor 8 is coupled through resistor 22 to the base of a driver transistor 7. The base of transistor 7 is connected through resistor 21 to a +20V source of operating voltage. The emitter of transistor 7 is coupled to the +20V source, while the collector of transistor 7 is coupled to the node of a diode 9. The cathode of diode 9 is coupled directly to the base of transistor 1 and coupled to the base of transistor 3 through resistor 16. The base of transistor 3 is coupled through resistor 17 to a −120V supply.

Transistors 1 and 3 are of opposite conductivity. Together with transistors 2 and 4, each of which are of the same conductivity, the four transistors form a quasi complementary push-pull amplifier 25 with an output terminal A, whose structure and operation is well known in the art. The collector of transistors 1 and 2 are coupled to each other and to the +20V source. The emitter of transistor 4 is coupled to the anode of a disconnect diode 10, whose cathode is coupled to ground. A biasing resistor 18 couples the base and emitter of transistor 2 to each other. A biasing resistor 19 couples the base and emitter of transistor 4 to each other. The output terminal A of amplifier 25 is coupled to one end of deflection winding 12. The other end of winding 12 is coupled in series to feedback resistor 13, a coupling capacitor 14 and the +20V source.

Terminal A is also coupled to a switching circuit 24. Switching circuit 24 couples the winding 12 to a −15V voltage source during retrace. Switching circuit 24 comprises a diode 11, which conducts during the first part of the retrace interval, and transistors 5 and 6, which conduct during the second part of the retrace interval. Biasing resistor 20 couples the collector of transistor 5 to the emitter of transistor 6 and to the −15V source. The base of transistor 5 is coupled to the junction of the collector of transistor 7 and one end of resistor 15. The other end of resistor 15 is coupled to the −120V supply.

In operation, during the first part of the trace interval, $T_0 - T_1$, the deflection winding current $I_y$ of FIG. 2C is negative and flows from the +20V source through coupling capacitor 14, feedback resistor 13, winding 12, transistor 4, and diode 10 to ground. Transistors 1 and 2 are off. As the input $V_{in}$ continues to rise, transistor 7 conducts to a greater extent and the voltage at its collector becomes more positive, decreasing the forward biasing of transistor 3. The deflection current $I_y$ thus decreases in magnitude.

At time $T_1$, when the deflection current is zero, $V_{in}$ has increased in magnitude sufficiently to shut off transistors 3 and 4 and turn on transistors 1 and 2. As $V_{in}$ continues to increase, deflection current $I_y$ reverses direction and begins to increase positively. Current flows from the more positive side of capacitor 14 through transistor 2, winding 12 and resistor 13 back to the less positive side of capacitor 14.

During the trace interval, a feedback voltage for maintaining a linear trace is developed across resistor 13 and is fed back to the emitter of error amplifying transistor 8.

At the end of the trace interval, at time $T_2$, the deflection winding current is at a maximum $+I_p$. The input voltage $V_{in}$ suddenly drops to its lowest value, reverse biasing the base-emitter junction of transistor 8. Transistor 8 is cutoff, and the retrace interval $T_2 - T_4$ begins.

At the start of retrace, transistor 7 is cutoff by transistor 8, thereby shutting off transistors 1 and 2. Transistors 3 and 4, although forward biased, will not conduct the deflection current which is flowing in the opposite direction. To sustain the existing current $+I_p$, the winding 12 develops a negative opposing voltage. The voltage at terminal A goes negative until diode 11 is forward-biased, clamping the winding at −15 volts minus the diode voltage drop (see FIG. 2B).

At this time, transistors 5 and 6 are forward-biased through resistor 15 to the −120V supply and are ready to conduct. However, no current flows through the transistors since current is flowing in the opposite direction to sustain $+I_p$. The current flows from the −15V source through diode 11 to the winding 12. Transistors 3 and 4 are still forward-biased through resistor 17 to the −120V supply and are ready to conduct; however, they are disconnected from ground by diode 10 which is reversed-biased. Diode 9 functions to prevent the base current of transistors 3 and 4 from raising the voltage at the collector of transistor 7 which turns on transistors 5 and 6.

When the winding current has decayed to zero at time $T_3$, the voltage at terminal A attempts to rise toward zero volts across winding 12. However, transistors 5 and 6 are still on; they begin to conduct and clamp terminal A to −15 volts $+V_{ceQ6}$. During the second part of retrace from $T_3 - T_4$, winding current builds up in the opposite direction, flowing from winding 12 through transistor 6 to the −15V source, and then through ground to the +20V source coupling capacitor 14, resistor 13, and back to the winding 12.

The winding 12, as above described, is coupled to a +20V source during the trace interval and is effectively coupled to a larger voltage source of approximately 35 volts (the series combination of 20 volts and 15 volts) during the retrace interval. This voltage, to which transistors 1 and 2 are also coupled, is still substantially lower than typically encountered in resonant retrace circuits. Cheaper lower rated output transistors can thereby be used. It should be understood by those skilled in the art that the invention may also be practiced by disconnecting the winding from the +20V source and coupling it directly to a 35 volt source during retrace.

As may be seen by inspection of FIGS. 2F and 2G, switching circuit 24 acts as a bidirectional switch, diode 11 conducting in one direction during the first part of retrace and transistors 5 and 6 conducting during the second part of retrace. The step increase in voltage at terminal A at time $T_3$ is just the sum of the forward drop voltage of diode 11 and $V_{ceQ6}$. The step occurs because of the changeover in conduction from diode 11 to transistor 6 during retrace. Note that transistors 5 and 6 are already biased into a conducting state at the beginning of retrace even though they conduct current only during the second part of retrace. This biasing provides a smooth current transition at time $T_3$, when the retrace current is reversing direction.

When the winding current has decreased to $-I_p$ at time $T_4$ providing for complete current reversal, the voltage at terminal B has also decreased sufficiently to turn on transistor 8. Transistor 7 then turns on, thereby increasing the voltage at the base of transistor 5, and with it the winding voltage at terminal A. When the voltage at A has become sufficiently positive, diode 10 is forward-biased and transistors 3 and 4, which are already in a conducting state, smoothly shunt the current through diode 10 to ground. The first part of the trace interval has thus started again.

As may be seen by inspection of FIGS. 2D and 2E, neither transistor 2 nor 4 conducts current during the retrace interval. The biasing is so arranged, that when transistors 3 and 4 conduct, transistors 5 and 6 are automatically cutoff. The forward voltage drop of diode 9 causes the voltage at the base of transistor 5 to be approximately 0.7V more positive than the base of transistor 3. Deflection current bypasses amplifier 25 during retrace and is coupled directly to the retrace voltage source by switching means 24. The only resistive dissipation during retrace is through either diode 11 or transistor 6 and the relatively minor resistances of winding 12 and resistor 13.

Switching means 24 also creates a well-defined retrace interval with sharp rise and fall time for precise blanking pulse width. The circuit is of low impedance so that auxiliary signals, such as for blanking, may be derived from the retrace voltage source without increasing the retrace time, the signals being picked off, for example, at terminal A.

What is claimed is:
1. A deflection circuit comprising:
   a deflection winding;
   a deflection amplifier with an output terminal coupled to said winding for providing current to said winding;
   a first voltage source coupled to said amplifier for providing an operating voltage to said amplifier;
   a source of input signals coupled to an input terminal of said amplifier for defining trace and retrace intervals during each deflection cycle, said signals turning off said amplifier at the end of the trace interval thereby causing a voltage to be developed across said winding opposing a change in current in said winding;
   a second voltage source; and
   switching means coupled to said input terminal and said output terminal of said amplifier and said second voltage source and being responsive to the voltages at said input and output terminals for coupling a greater magnitude voltage across said winding during said retrace interval and bypassing current away from said amplifier during said retrace interval.
2. A deflection circuit according to claim 1, wherein said deflection amplifier comprises first and second serially coupled transistors in a push-pull configuration, wherein a junction of said first and second transistors forms said output terminal of said deflection amplifier.
3. A deflection circuit according to claim 2, wherein said second transistor conducts current only during a first part of said trace interval but is also biased for conducting current during said retrace interval.

4. A deflection circuit according to claim 2, wherein said second transistor is coupled to a diode, said diode preventing current of said winding from passing through the main conducting path of said second transistor during said retrace interval.

5. A deflection circuit according to claim 3, wherein said second transistor is coupled to a diode, said diode preventing current of said winding from passing through the main conducting path of said second transistor during said retrace interval.

6. A deflection circuit according to claim 1 wherein said switching means includes a controlled semiconductor having a control terminal coupled to said input terminal of said amplifier and having an output terminal coupled to said output terminal of said amplifier for controlling the conduction of said switching means during a first portion of said retrace interval.

7. A deflection circuit according to claim 6 wherein said switching means includes a switch transistor which conducts the current flowing through said winding during said first portion of said retrace interval, conduction of said switch transistor being controlled by said controlled semiconductor.

8. A deflection circuit according to claim 7 wherein said controlled semiconductor comprises a transistor having its base and emitter coupled between said input and output terminals of said amplifier.

9. A deflection circuit according to claim 8 wherein said switching means includes a diode poled for conduction during a second portion of said retrace interval.

* * * * *